United States Patent
Song

(10) Patent No.: US 10,496,116 B2
(45) Date of Patent: Dec. 3, 2019

(54) SMALL CAPACITANCE COMPENSATION NETWORK CIRCUIT

(71) Applicant: SHENZHEN WINSEMI MICROELECTRONICS CO., LTD., Shenzhen, Guangdong (CN)

(72) Inventor: Lijun Song, Guangdong (CN)

(73) Assignee: SHENZHEN WINSEMI MICROELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 16/078,905

(22) PCT Filed: May 3, 2017

(86) PCT No.: PCT/CN2017/082896
§ 371 (c)(1),
(2) Date: Aug. 22, 2018

(87) PCT Pub. No.: WO2018/201342
PCT Pub. Date: Nov. 8, 2018

(65) Prior Publication Data
US 2019/0310672 A1   Oct. 10, 2019

(51) Int. Cl.
*H03F 3/04* (2006.01)
*G05F 1/565* (2006.01)
(Continued)

(52) U.S. Cl.
CPC ............... *G05F 1/565* (2013.01); *H03F 1/56* (2013.01); *H03H 11/483* (2013.01); *H03F 2203/45544* (2013.01)

(58) Field of Classification Search
CPC .. G05F 1/565; H03F 1/56; H03F 2203/45544; H03H 11/483
See application file for complete search history.

(56) References Cited

U.S. PATENT DOCUMENTS 6,731,163 B2 * 5/2004 Huckins ................. H03F 1/086
330/292
7,081,789 B2 * 7/2006 Klemmer ................ H03F 1/30
327/554
(Continued)

FOREIGN PATENT DOCUMENTS

CN   202276072 U   6/2012
CN   102697500 A   10/2012
CN   105487730 A   4/2016

*Primary Examiner* — Dinh T Le
(74) *Attorney, Agent, or Firm* — Muncy, Geissler, Olds & Lowe, P.C.

(57) ABSTRACT

A small capacitance compensation network circuit, the first switch module (201) and the second switch (202) module are alternately switched between a switched-off state and a switched-on state, so that the compensation capacitor C3 is charged by the capacitor C1; and the third switch module (203) and the fourth switch module (204) are alternately switched between the switched-off state and the switched-on state, so that the compensation capacitor C3 is discharged to charge the capacitor C2, by controlling the alternate switch-on of the first switch module (201) and the second switch module (202), the third switch module (203) and the fourth switch module (204) causes the deviation of the capacitor C1 and the capacitor C2 to be processed and obtain the error signal. Therefore, the compensation capacitor C3 can be designed to be very small, which facilitates the integration of the integrated circuit, eliminates the need for external compensation capacitors and integrated circuit pins, reduces the system cost, and improves the reliability. Therefore, it is solved the problem that the existing compensation network technology has high cost in the power control circuit and poor reliability in the power supply.

10 Claims, 4 Drawing Sheets

(51) Int. Cl.
*H03H 11/48* (2006.01)
*H03F 1/56* (2006.01)

(56) References Cited

U.S. PATENT DOCUMENTS

| | | | |
|---|---|---|---|
| 7,595,616 B2 * | 9/2009 | Prexl | H02M 3/1588 |
| | | | 323/280 |
| 2010/0066414 A1 | 3/2010 | Wang | |
| 2016/0342276 A1 | 11/2016 | Lu | |

\* cited by examiner

SMALL CAPACITANCE COMPENSATION
NETWORK CIRCUIT

TECHNICAL FIELD

The present application relates to the technical field of integrated circuits, and more particularly to a small capacitance compensation network circuit.

BACKGROUND

Most switch power supplies or linear power supplies have compensation links, an output signal of a compensation link sampling system is also a controlled target amount. By comparing with the reference signal, an error signal is generated to control an output power of a power device, thereby achieving the purpose of controlled voltage type or current type output. During the above process, the compensation link can realize the low frequency and high gain of the circuit and achieve the purpose of accurately controlling the controlled target amount.

A typical compensation link comprises a proportional link and an inertial link and is designed as appropriate parameters according to requirements. In some systems, such as power factor correction circuits, because the line frequency is 50/60 Hz, in order to make the system stable during a power frequency cycle, usually an inertial link with a bandwidth of 10 Hz is needed. To achieve this, the traditional approach is to use a relatively large compensation capacitor, while the capacitance of this compensation capacitor determines that it is difficult to be integrated by the integrated circuit, therefore, the integrated circuit usually needs a dedicated pin to connect the external capacitor to obtain a basic stable error signal within the power frequency cycle. In the above traditional compensation network, there are the following problems: firstly, the compensation capacitor requires cost and occupies space; secondly, the dedicated pin of the integrated circuit also accounts for the system cost; and thirdly, in a high temperature and humidity environment, the external compensation capacitor may leak current on the printed circuit board, which may cause system failure.

Therefore, the existing compensation network technology has the problems of high cost in the power control circuit and low reliability in the power supply.

SUMMARY

An object of the present application is to provide a small capacitance compensation network circuit to solve the problem that the existing compensation network technology has high cost in the power control circuit and low reliability in the power supply.

The present application provides a small capacitance compensation network circuit. The small capacitance compensation network circuit comprises:

a first switch module, a second switch module, a third switch module, a fourth switch module, a capacitor C1, a capacitor C2, a compensation capacitor C3, a resistor R1, a resistor R2, a first amplification module, a second amplification module, a reference current source, and voltage-controlled current source;

a first end of the first switch module, an output end of the first amplification module and a first end of the resistor R1 are jointly connected; a first input end of the first amplification module, a first input end of the second amplification module and the compensation capacitor C3 are jointly connected; a second input end of the first amplification module, a second end of the resistor R1 and a input end of the reference current source are jointly connected; an output end of the reference current source is grounded; a second end of the first switch module, a first end of the second switch module and a first end of the capacitor C1 are jointly connected; a second end of the second switch module, a first end of the third switch module and a first end of the compensation capacitor C3 are jointly connected; a second end of the third switch module, a first end of the fourth switch module and a first end of the capacitor C2 are jointly connected; a second end of the capacitor C1, a second end of the compensation capacitor C3 and a second end of the capacitor C2 are grounded; a second end of the fourth switch module, a first end of the resistor R2 and an output end of the second amplification module are jointly connected; an output end of the voltage-controlled current source, a second end of the resistor R2 and a second end of the second amplification module are jointly connected;

the first switch module and the second switch module are alternately switched between the switched-off state and the switched-on state, and the third switch module and the fourth switch module are alternately switched between the switched-off state and the switched-on state;

when the first switch module is switched on and the second switch module is switched off, the electrical signal output by the reference current source is amplified by the first amplification module and then charges the capacitor C1;

when the first switch module is switched off and the second switch module is switched on, the capacitor C1 charges the compensation capacitor C3;

when the third switch module is switched on and the fourth switch module is switched off, the compensation capacitor C3 is discharged to charge the capacitor C2;

by controlling the alternate switch-on of the first switch module, the second switch module, the third switch module, and the fourth switch module, the deviation between the capacitor C1 and the capacitor C2 is processed, and an error signal is obtained.

In summary, the present application provides a small capacitance compensation network circuit comprising a first switch module, a second switch module, a third switch module, a fourth switch module, a capacitor C1, a capacitor C2, a compensation capacitor C3, a resistor R1, a resistor R2, a first amplification module, a second amplification module, a reference current source and a voltage-controlled current source; the first switch module and the second switch module are alternately switched between a switched-off state and a switched-on state, so that the capacitor C1 is enabled to charge the compensation capacitor C3; and the third switch module and the fourth switch module are alternately switched between the switched-off state and the switched-on state, so that the compensation capacitor C3 is discharged to charge the capacitor C2; by controlling the alternate switch-on of the first switch module and the second switch module, the third switch module and the fourth switch module, the deviation of the capacitor C1 and the capacitor C2 are processed, and the error signal is obtained. In this way, by matching the capacitance of the capacitor C1 and the capacitance of the capacitor C2 and by controlling the alternate switch-on of the first switch module, the second switch module, the third switch module and the fourth switch module, the influence of the capacitance deviation between the capacitors C1 and C2 are eliminated to get the accurate error signal; at the same time, the compensation capacitor C3 can be designed to be very small, which facilitates the integration of the integrated circuit, eliminates the need for external compensation capacitors and integrated circuit pins, reduces the system cost, and improves the reliability. Therefore, it is solved the problem that the existing compensation network technology has high cost in the power control circuit and poor reliability in the power supply.

DETAILED DESCRIPTION OF THE EMBODIMENTS

In order to make the purpose, technical solutions, and beneficial effects of the present application clearer and more understandable, the present application will be further described in detail herein after with reference to the accompanying drawings and embodiments. It should be understood that the embodiments described herein are only intended to illustrate but not to limit the present application.

The small capacitance compensation network circuit provided by the embodiment of the present invention can realize accurate and minute charging current and discharging current, and the capacitance of the compensation capacitor C3 can be designed to be very small, which facilitates the integration of the integrated circuit, eliminates the need for external compensation capacitors and integrated circuit pins, reduces the system cost, and improves the reliability.

In order to explain the technical solutions described in the present application, the following description will be given through specific embodiments.

Figure 1:
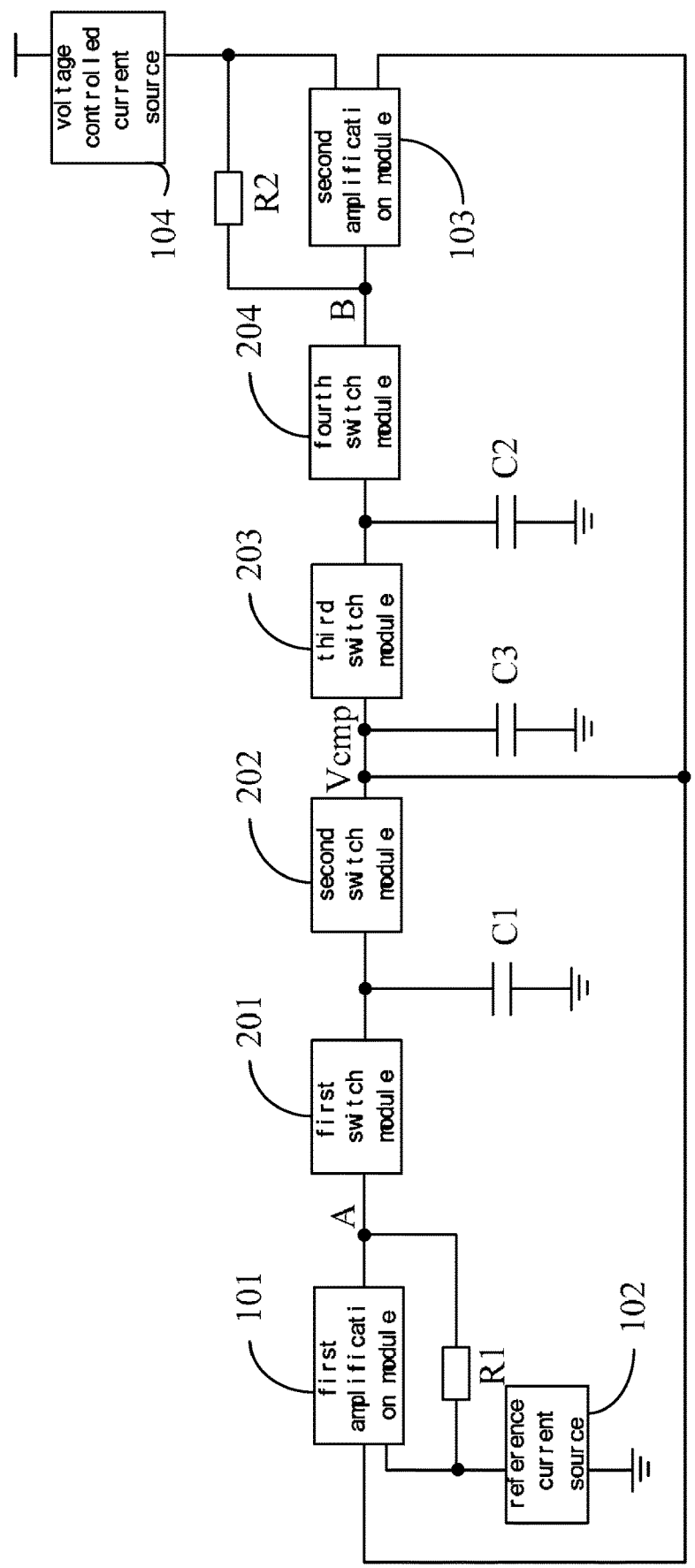
FIG. 1 is a schematic structural diagram of a small capacitance compensation network circuit according to an embodiment of the present application.
Figure 2:
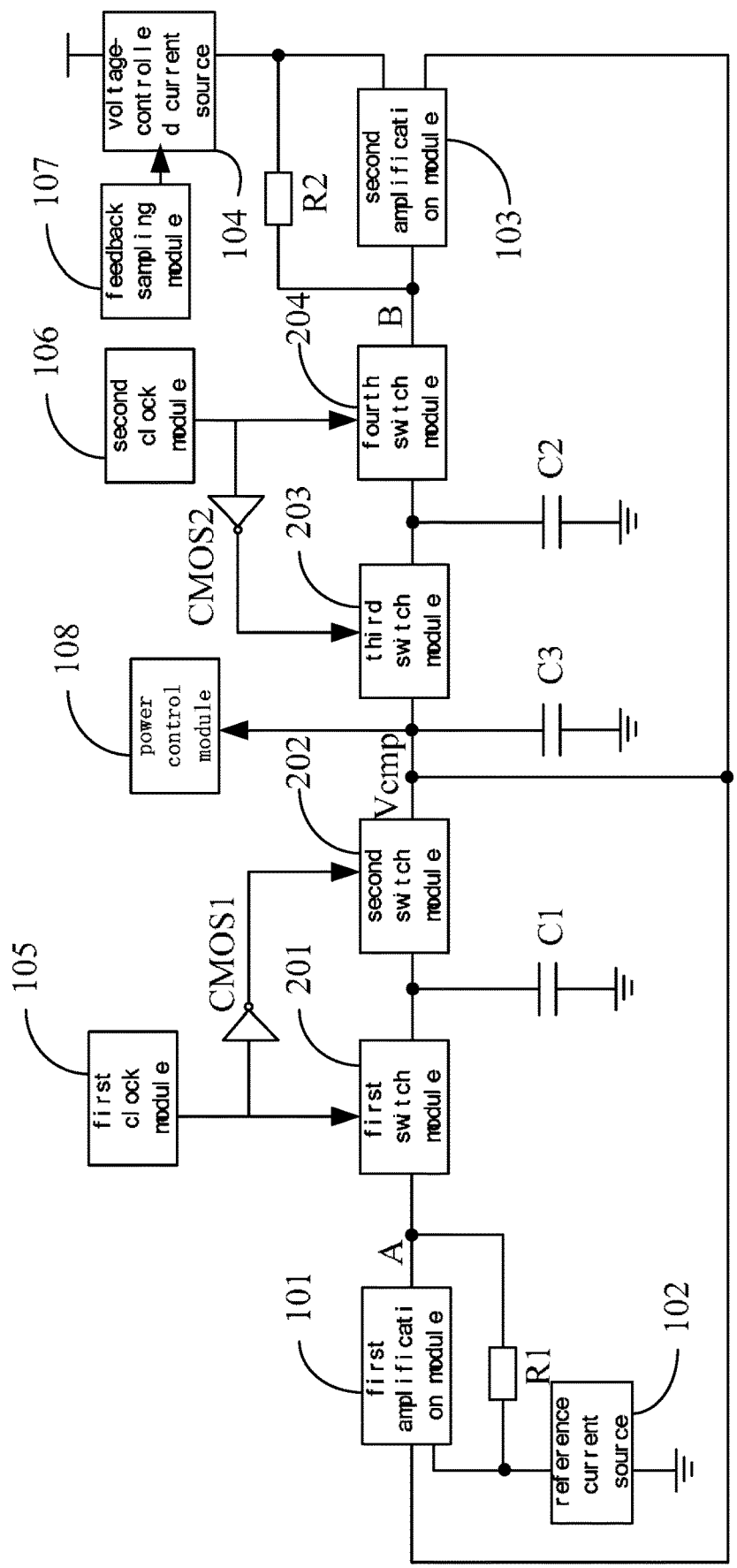
FIG. 2 is a schematic structural diagram of a small capacitance compensation network circuit according to an embodiment of the present application.

FIG. 1 and FIG. 2 show a module structure of a small capacitance compensation network circuit according to an embodiment of the present application, for ease of description, only the parts related to the embodiment of the present invention are shown, which are described in detail as follows:

The above small capacitance compensation network circuit comprises:

a first switch module 201, a second switch module 202, a third switch module 203, a fourth switch module 204, a capacitor C1, a capacitor C2, a compensation capacitor C3, a resistor R1, a resistor R2, a first amplification module 101, a second amplification module 103, a reference current source 102, and a voltage-controlled current source 104;

a first end of the first switch module 201, an output end of the first amplification module 101 and a first end of the resistor R1 are jointly connected; a first input end of the first amplification module 101, a first input end of the second amplification module 103 and the compensation capacitor C3 are jointly connected; a second input end of the first amplification module 101, a second end of the resistor R1 and an input end of the reference current source 102 are jointly connected; an output end of the reference current source 102 is grounded; a second end of the first switch module 201, a first end of the second switch module 202 and a first end of the capacitor C1 are jointly connected; a second end of the second switch module 202, a first end of the third switch module 203 and a first end of the compensation capacitor C3 are jointly connected; a second end of the third switch module 203, a first end of the fourth switch module 204 and a first end of the capacitor C2 are jointly connected; a second end of the capacitor C1, a second end of the compensation capacitor C3 and a second end of the capacitor C2 are grounded; a second end of the fourth switch module 204, a first end of the resistor R2 and an output end of the second amplification module 103 are jointly connected; an output end of the voltage-controlled current source 104, a second end of the resistor R2 and a second end of the second amplification module 103 are jointly connected;

the first switch module 201 and the second switch module 202 are alternately switched between a switched-off state and a switched-on state, and the third switch module 203 and the fourth switch module 204 are alternately switched between a switched-off state and a switched-on state;

when the first switch module 201 is switched on and the second switch module 202 is switched off, the electrical signal output by the reference current source 102 is amplified by the first amplification module 101 and then charges the capacitor C1;

when the first switch module 201 is switched off and the second switch module 202 is switched on, the capacitor C1 charges the compensation capacitor C3;

when the third switch module 203 is switched on and the fourth switch module 204 is switched off, the compensation capacitor C3 is discharged to charge the capacitor C2;

by controlling the alternate switch-on of the first switch module 201, the second switch module 202, the third switch module 203, and the fourth switch module 204, the deviation between the capacitor C1 and the capacitor C2 is processed, and an error signal is obtained.

As an embodiment of the present application, the small capacitance compensation network circuit further comprises a feedback sampling module 107, an output end of the feedback sampling module 107 is connected with a controlled end of the voltage-controlled current source 104, and the feedback sampling module 107 is used to control the current output of the voltage-controlled current source 104. The feedback sampling module 107 is configured to detect the controlled output signal amount of the system and control the current output of the voltage-controlled current source 104 proportionally.

As an embodiment of the present application, the small capacitance compensation network circuit further comprises:

a first clock module 105, a second clock module 106, a first inverter CMOS1, and a second inverter CMOS2;

an output end of the first clock module 105, an input end of the first inverter CMOS1 and a controlled end of the first switch module 201 are jointly connected; an output end of the first inverter CMOS1 is connected with a controlled end of the second switch module 202; an output end of the second clock module 106, an input end of the second inverter CMOS2 and a controlled end of the third switch module 203 are jointly connected; an output end of the second inverter CMOS2 is controlled with a controlled end of the fourth switch module 204;

the first clock module 105 and the first inverter CMOS1 jointly control the first switch module 201 and the second switch module 202 to alternately switch between a switched-off state and a switched-on state, and the second clock module 106 and the second inverter CMOS2 jointly controls the third switch module 203 and the fourth switch module 204 to alternately switch between the switched-off state and the switched-on state where an output of the first clock module 105 and the second clock module 106 may be any pulse signal, such as a drive pulse of a power switch. Of course, the outputs of the first clock module 105 and the second clock module 106 may be the same signal or different signals as long as the first switch module 201 and the second switch module 202 can be switched on and off complementarily, and also can implement the three switch module 203 and the fourth switch module 204 can be switched on and off complementarily.

As an embodiment of the present application, the small capacitance compensation network circuit further comprises a power control module 108, an input end of the power control module 108 is connected with a first end of the compensation capacitor C3. The power control module 108 is used to control the power output of the small capacitance compensation network circuit. The input signal of the power control module 108 is the voltage of the compensation capacitor C3. The power control module 108 controls the output power of the system by controlling the power switch duty cycle or current.

Figure 3:
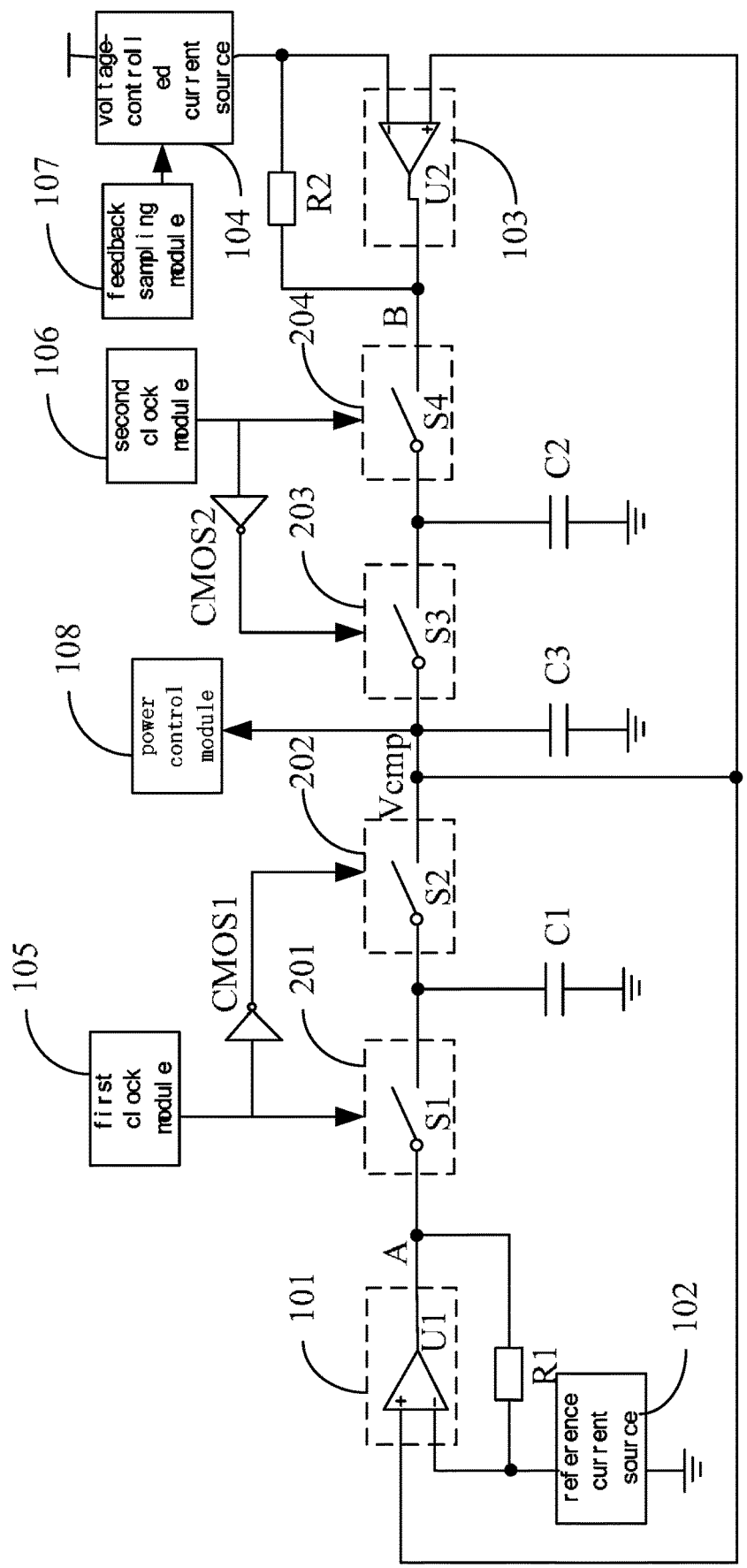
FIG. 3 is an exemplary circuit diagram of a small capacitance compensation network circuit according to an embodiment of the present application.

FIG. 3 shows an exemplary circuit of a small capacitance compensation network circuit according to an embodiment of the present application. For ease of description, only the parts related to the embodiment of the present application are shown, which are described in detail as follows:

as an embodiment of the present application, the first switch module 201 comprises any one of a mechanical switch (shown as a switch S1 in FIG. 3), a triode, or a field effect transistor;

a first end and a second end of the mechanical switch act as a first end and a second end of the first switch module 201 respectively;

a collector, an emitter and a base of the triode act as a first end, a second end and a controlled end of the first switch module 201 respectively;

a drain, a source, and a gate of the field effect transistor act as a first end, a second end, and a controlled end of the first switch module 201 respectively.

As an embodiment of the present application, the above second switch module 202 comprises any one of a mechanical switch (shown as a switch S2 in FIG. 3), a triode, or a field effect transistor;

a first end and a second end of the mechanical switch act as a first end and a second end of the second switch module 202 respectively;

a collector, an emitter and a base of the triode act as a first end, a second end and a controlled end of the second switch module 202 respectively;

a drain, a source, and a gate of the field effect transistor act as a first end, a second end, and a controlled end of the second switch module 202 respectively.

As an embodiment of the present application, the above third switch module 203 comprises any one of a mechanical switch (shown as a switch S3 in FIG. 3), a triode, or a field effect transistor.

a first end and a second end of the mechanical switch act as a first end and a second end of the third switch module 203 respectively;

a collector, an emitter and a base of the triode act as a first end, a second end and a controlled end of the third switch module 203 respectively;

a drain, a source, and a gate of the field effect transistor act as a first end, a second end, and a controlled end of the third switch module 203 respectively.

As an embodiment of the present application, the above fourth switch module 204 comprises any one of a mechanical switch (shown as a switch S4 in FIG. 3), a triode, or a field effect transistor.

A first end and a second end of the mechanical switch act as a first end and a second end of the fourth switch module 204 respectively;

a collector, an emitter and a base of the triode act as a first end, a second end and a controlled end of the fourth switch module 204 respectively;

a drain, a source, and a gate of the field effect transistor act as a first end, a second end, and a controlled end of the fourth switch module 204 respectively.

As an embodiment of the present application, the above first amplification module 101 comprises an operational amplifier U1; and a non-inverting input end, an inverting input end and an output end of the operational amplifier U1 act as a first input end, a second input end and an output end of the first amplification module 101 respectively.

As an embodiment of the present application, the above second amplification module 103 comprises an operational amplifier U2; and a non-inverting input end, an inverting input end and an output end of the operational amplifier U1 act as a first input end, a second input end and an output end of the second amplification module 103 respectively.

Figure 4:
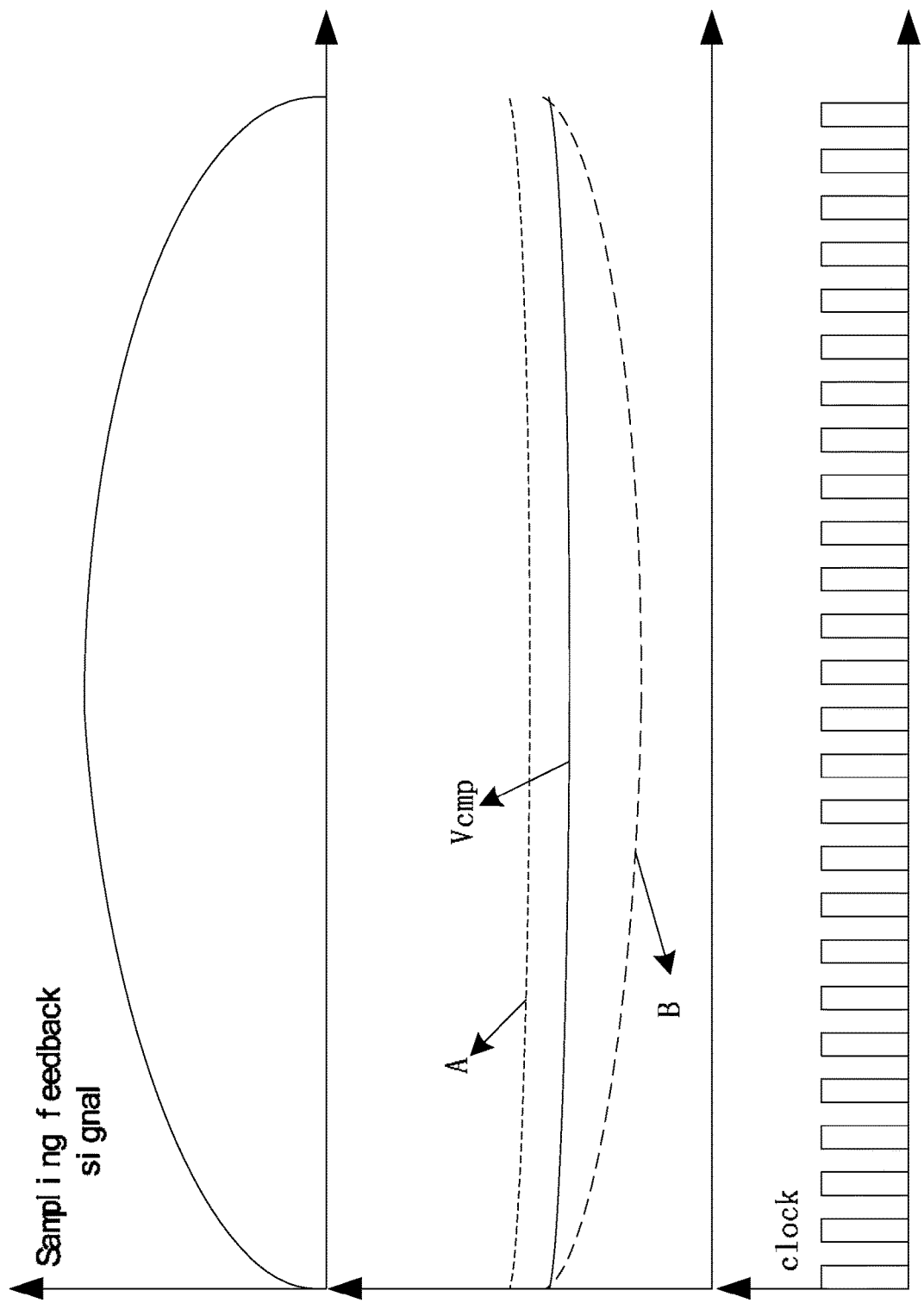
FIG. 4 is a waveform diagram of each signal point in a small capacitance compensation network circuit according to an embodiment of the present application.

FIG. 4 shows waveforms of signal points in the small capacitance compensation network circuit according to an embodiment of the present application, and the working principle of the above small capacitance compensation network circuit will be described below with reference to FIGS. 3 and 4:

Since the inverting input end of the operational amplifier U1 is high impedance, the current in the reference current source 102 flows through the resistor R1 and a voltage Iref*R1 is generated across the resistor R1. When the operational amplifier U1 is closed-loop, the voltages at the non-inverting input end and the inverting input end are equal, so that the voltage at the point A is Va=Vcmp+Iref*R1, wherein the Iref in the equation is the current of the reference current source 102, that is, the voltage at the point A is always Iref*al higher than the compensation capacitor voltage Vcmp.

When switch S1 is switched on and switch S2 is switched off, the voltage of a capacitor C1 is charged to equal the voltage at point A; when switch S2 is switched on and switch S1 is switched off, the capacitor C1 is connected in parallel with compensation capacitor C3 and the charge on capacitor C1 is transferred to compensation capacitor C3, after switch S2 is switched on, the new voltage of Vcmp is:

$$Vcmp1=(C1*(Vcmp0+Iref*R1)+Ccmp*Vcmp0)/(C1+Ccmp0)$$

In the above equation, Vcmp0 is the voltage of the compensation capacitor C3 before the switch S2 is switched on, and Vcmp1 is the voltage of the compensation capacitor C3 after the switch S2 is switched on. In the design, the compensation capacitor C3 is more than tens of times larger than the capacitor C1 and the capacitor C2, so it can be obtained:

$$Vcmp1 \approx (C1*Iref*R1)/Ccmp0+Vcmp0$$

That is, after each switch of the switch S1 and the switch S2 is completed, the increase value of the voltage of the compensation capacitor C3 is fixed, after many times of the switch, the average current of the voltage of the compensation capacitor C3 is fixed and minute.

Similarly, at the operational amplifier U2, the voltage at point B is Vb=Vcmp−Vfb*gm*R2, wherein the Vfb in the equation is the output voltage of the feedback sampling module 107, and gm is the gain of the voltage-controlled current source 104. Similarly, after the switches S3 and S4 are alternately switched once, the voltage of the compensation capacitor C3 changes as follows:

$$Vcmp1 \approx Vcmp0 - (C2*Vfb*gm*R2)/Ccmp0$$

Therefore, the average discharge current of the compensation capacitor C3 is proportional to Vfb.

It can be seen from the above inference that the charging current of the compensation capacitor C3 is fixed, and the discharging current of the compensation capacitor C3 is proportional to the signal of the feedback sampling module 107, so that the error of the charging current and the discharging current is integrated on the compensation capacitor C3 and the circuit error signal can be obtained. By matching the capacitance of the capacitors C1 and C2 and using the same clock to control the alternate switch-on of the switch S1, the switch S2, the switch S3, and the switch S4, the influence of the deviation of the capacitance of the capacitors C1 and C2 can be eliminated and an accurate error signal can be obtained. Therefore, accurate and minute charging current and discharging current can be achieved, the capacitance of the compensation capacitor C3 can be designed to be very small, which facilitates the integration of the integrated circuit, eliminates the need for external compensation capacitors and integrated circuit pins, reduces the system cost, and improves the reliability.

In summary, the present application provides a small capacitance compensation network circuit comprising a first switch module, a second switch module, a third switch module, a fourth switch module, a capacitor C1, a capacitor C2, a compensation capacitor C3, a resistor R1, a resistor R2, a first amplification module, a second amplification module, a reference current source and a voltage-controlled current source; the first switch module and the second switch module are alternately switched between a switched-off state and a switched-on state, so that is charged the compensation capacitor C3 is charged by the capacitor C1; and the third switch module and the fourth switch module are alternately switched between the switched-off state and the switched-on state, so that the compensation capacitor C3 is discharged to charge the capacitor C2; by controlling the alternate switch-on of the first switch module and the second switch module, the third switch module and the fourth switch module, the deviation of the capacitor C1 and the capacitor C2 is processed and the error signal is obtained. In this way, matching of the capacitances between the capacitors C1 and C2 are realized, and the alternate switch-on of the first switch module, the second switch module, the third switch module and the fourth switch module is controlled, and the influence of the deviation of the capacitance of the capacitors C1 and C2 are eliminated to get the accurate error signal; at the same time, the compensation capacitor C3 can be designed to be very small, which facilitates the integration of the integrated circuit, eliminates the need for external compensation capacitors and integrated circuit pins, reduces the system cost, and improves the reliability. Therefore, it is solved the problem that the existing compensation network technology has high power control circuit cost and poor power reliability.

Persons of ordinary skill in the art may understand that the steps or some steps of implementing the above method embodiments may be accomplished by program instructions related hardware, and the above program may be stored in a computer-readable storage medium. When the program is executed, the execution comprise: the steps of the above method embodiment, and the above storage medium comprise various media that can store program codes, such as a ROM, a RAM, a magnetic disk, or an optical disc.

The aforementioned embodiments are only used to illustrate the technical solutions of the present application, rather than limiting thereof; although the present application has been described in detail with reference to the foregoing embodiments, persons of ordinary skill in the art should understand that they can still modify the technical solutions described in the above embodiments, or equivalently replace some of the technical features; and these modifications or replacements do not make the nature of the corresponding technical solutions depart from the spirit and scope of the technical solutions of the embodiments of the present application.

The aforementioned embodiments are only preferred embodiments of the present application, and are not intended to limit the present application. Any modification, equivalent replacement, improvement, and so on, which are made within the spirit and the principle of the present application, should be included in the scope of the present utility model. Therefore, the scope of the present application is subject to the scope of the claims.

What is claimed is:

1. A small capacitance compensation network circuit, wherein the small capacitance compensation network circuit comprises:
    a first switch module, a second switch module, a third switch module, a fourth switch module, a capacitor C1, a capacitor C2, a compensation capacitor C3, a resistor R1, a resistor R2, a first amplification module, a second amplification module, a reference current source, and a voltage-controlled current source;
    a first end of the first switch module, an output end of the first amplification module and a first end of the resistor R1 are jointly connected; a first input end of the first amplification module, a first input end of the second amplification module and the compensation capacitor C3 are jointly connected; a second input end of the first amplification module, a second end of the resistor R1 and an input end of the reference current source are jointly connected; an output end of the reference current source is grounded; a second end of the first switch module, a first end of the second switch module and a first end of the capacitor C1 are jointly connected; a second end of the second switch module, a first end of the third switch module and a first end of the compensation capacitor C3 are jointly connected; a second end of the third switch module, a first end of the fourth switch module and a first end of the capacitor C2 are jointly connected; a second end of the capacitor C1, a second end of the compensation capacitor C3 and a second end of the capacitor C2 are grounded; a second end of the fourth switch module, a first end of the resistor R2 and an output end of the second amplification module are jointly connected; an output end of the voltage-controlled current source, a second end of the resistor R2 and a second end of the second amplification module are jointly connected;
    the first switch module and the second switch module are alternately switched between a switched-off state and a switched-on state, and the third switch module and the fourth switch module are alternately switched between a switched-off state and a switched-on state;
    when the first switch module is switched on and the second switch module is switched off, the electrical signal output by the reference current source is amplified by the first amplification module and then charges the capacitor C1;

when the first switch module is switched off and the second switch module is switched on, the capacitor C1 charges the compensation capacitor C3;

when the third switch module is switched on and the fourth switch module is switched off, the compensation capacitor C3 is discharged to charge the capacitor C2;

by controlling the alternate switch-on of the first switch module, the second switch module, the third switch module, and the fourth switch module, the deviation between the capacitor C1 and the capacitor C2 is processed, and an error signal is obtained.

2. The small capacitance compensation network circuit of claim 1, wherein the small capacitance compensation network circuit comprises:

a feedback sampling module;

an output end of the feedback sampling module is connected with a controlled end of the voltage-controlled current source; and the feedback sampling module is used to control a current output of the voltage-controlled current source.

3. The small capacitance compensation network circuit of claim 1, wherein the small capacitance compensation network circuit further comprises:

a first clock module, a second clock module, a first inverter, and a second inverter;

an output end of the first clock module, an input end of the first inverter and a controlled end of the first switch module are jointly connected; an output end of the first inverter is connected with a controlled end of the second switch module; an output end of the second clock module, an input end of the second inverter and a controlled end of the third switch module are jointly connected; an output end of the second inverter is controlled with a controlled end of the fourth switch module; and the first clock module and the first inverter jointly control the first switch module and the second switch module to alternately switch between a switched-off state and a switched-on state, and the second clock module and the second inverter jointly controls the third switch module and the fourth switch module to alternately switch between the switched-off state and the switched-on state.

4. The small capacitance compensation network circuit of claim 1, wherein the small capacitance compensation network circuit further comprises:

a power control module;

an input end of the power control module is connected with a first end of the compensation capacitor C3; and the power control module is used to control the power output of the small capacitance compensation network circuit.

5. The small capacitance compensation network circuit of claim 1, wherein the first switch module comprises any one of a group consisting of a mechanical switch, a triode and a field effect transistor;

a first end and a second end of the mechanical switch act as a first end and a second end of the first switch module respectively;

a collector, an emitter and a base of the triode act as a first end, a second end and a controlled end of the first switch module respectively; and a drain, a source, and a gate of the field effect transistor act as a first end, a second end, and a controlled end of the first switch module respectively.

6. The small capacitance compensation network circuit of claim 1, wherein the second switch module comprises any one of a group consisting of a mechanical switch, a triode and a field effect transistor;

a first end and a second end of the mechanical switch act as a first end and a second end of the second switch module respectively;

a collector, an emitter and a base of the triode act as a first end, a second end and a controlled end of the second switch module respectively; and a drain, a source, and a gate of the field effect transistor act as a first end, a second end, and a controlled end of the second switch module respectively.

7. The small capacitance compensation network circuit of claim 1, wherein the third switch module comprises any one of a group consisting of a mechanical switch, a triode and a field effect transistor;

a first end and a second end of the mechanical switch act as a first end and a second end of the third switch module respectively;

a collector, an emitter and a base of the triode act as a first end, a second end and a controlled end of the third switch module respectively; and a drain, a source, and a gate of the field effect transistor act as a first end, a second end, and a controlled end of the third switch module respectively.

8. The small capacitance compensation network circuit of claim 1, wherein the fourth switch module comprises any one of a group consisting of a mechanical switch, a triode and a field effect transistor;

a first end and a second end of the mechanical switch act as a first end and a second end of the fourth switch module respectively;

a collector, an emitter and a base of the triode act as a first end, a second end and a controlled end of the fourth switch module respectively; and a drain, a source, and a gate of the field effect transistor act as a first end, a second end, and a controlled end of the fourth switch module respectively.

9. The small capacitance compensation network circuit of claim 1, wherein the first amplification module comprises an operational amplifier, and a non-inverting input end, an inverting input end and an output end of the operational amplifier act as a first input end, a second input end and an output end of the first amplification module respectively.

10. The small capacitance compensation network circuit of claim 1, wherein the second amplification module comprises an operational amplifier, a non-inverting input end, an inverting input end and an output end of the operational amplifier act as a first input end, a second input end and an output end of the second amplification module respectively.

* * * * *